(12) United States Patent
Logan et al.

(10) Patent No.: US 10,349,517 B2
(45) Date of Patent: Jul. 9, 2019

(54) PAD PATTERNS

(71) Applicant: HEWLETT-PACKARD DEVELOPMENT COMPANY, L.P., Houston, TX (US)

(72) Inventors: Charles Nathan Logan, Boise, ID (US); Adrian Rothenbuhler, Boise, ID (US); Christine M. Wells, Boise, ID (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 15/570,879

(22) PCT Filed: Jun. 29, 2015

(86) PCT No.: PCT/US2015/038270
§ 371 (c)(1),
(2) Date: Oct. 31, 2017

(87) PCT Pub. No.: WO2017/003422
PCT Pub. Date: Jan. 5, 2017

(65) Prior Publication Data
US 2018/0295719 A1    Oct. 11, 2018

(51) Int. Cl.
*H05K 1/11* (2006.01)
*H05K 3/40* (2006.01)
(Continued)

(52) U.S. Cl.
CPC ............ *H05K 1/0275* (2013.01); *H05K 1/09* (2013.01); *H05K 1/111* (2013.01); *H05K 1/112* (2013.01); *H05K 3/4007* (2013.01); *H05K 3/4038* (2013.01); *H05K 1/0298* (2013.01); *H05K 2201/094* (2013.01);
(Continued)

(58) Field of Classification Search
CPC ........ H05K 1/111; H05K 1/115; H05K 1/116; H05K 3/4007; H05K 3/4038; H05K 3/46; H05K 3/4053; H05K 3/4076; H05K 3/4084
See application file for complete search history.

(56) References Cited

U.S. PATENT DOCUMENTS

| 5,861,662 A | 1/1999 | Candelore |
| 6,162,997 A | 12/2000 | Memis |

(Continued)

FOREIGN PATENT DOCUMENTS

| JP | 11288450 | 10/1999 |
| WO | WO-2004086202 A1 | 10/2004 |

OTHER PUBLICATIONS

Abramovici, et al. Integrated Circuit Security—New Threats and Solutions. DAFCA Hardware Security. Apr. 2009.

*Primary Examiner* — Jeremy C Norris
(74) *Attorney, Agent, or Firm* — HP Inc. Patent Department (57) ABSTRACT

In one implementation, a printed circuit board (PCB) includes a plurality of pads that form a pad pattern on the PCB. In that implementation, the plurality of pads include a group of load pads, a dummy pad, and a false pad. The group of load pads act as contact points to establish an electrical path between a first circuitry and a second circuitry. The dummy pad is coupled to a via that floats electrically and the false pad is coupled to a third circuitry.

15 Claims, 6 Drawing Sheets

(51) Int. Cl.
*H05K 1/02* (2006.01)
*H05K 1/09* (2006.01)
(52) U.S. Cl.
CPC .............. *H05K 2201/09227* (2013.01); *H05K 2201/09409* (2013.01); *H05K 2201/09781* (2013.01)

(56) References Cited

U.S. PATENT DOCUMENTS

| | | |
|---|---|---|
| 7,296,299 B2 | 11/2007 | Schwenck et al. |
| 2006/0219427 A1 | 10/2006 | Haridass et al. |
| 2008/0205011 A1 | 8/2008 | Chin et al. |
| 2010/0175911 A1 | 7/2010 | Morrison |
| 2011/0253782 A1 | 10/2011 | Campbell et al. |
| 2015/0092373 A1 | 4/2015 | Chan et al. |
| 2018/0226467 A1* | 8/2018 | Ka ..................... H01L 27/3276 |

* cited by examiner

PAD PATTERNS

BACKGROUND

Printed circuit boards (PCB) are used to create circuitry useable by electronics to perform electronic communications and perform operations. PCBs generally electrically connect electronic components using conductive traces, pads, and other features etched from conductive metal sheets placed on a non-conductive substrate.

DETAILED DESCRIPTION

In the following description and figures, some example implementations of example printed circuit boards, example circuit systems, and/or example manufacturing processes are described. In general, a printed circuit board (PCB) comprises layers of conductive traces and the traces may be connected to vias and the traces and vies form conductive paths through the PCB, and the conductive paths may connect to a power net, a ground net, or other circuitry, such as a conductive pad or an integrated circuit. A conductive material is used to form the conductive portions of the PCB (e.g., the conductive traces and conductive pads). Example conductive materials are generally metals, such as copper, or a metal alloy, such as tin. A PCB, as used herein, may refer to a board without embedded components or a board populated with components, such as a printed board assembly (PBA), a printed circuit assembly (PCA), a printed circuit board assembly (PCBA), a backplane, or a circuit card assembly (CCA). Any of these examples of PCBs may also be considered a circuit system, as used herein, and a circuit system may comprise non-PCB systems of circuitry (such as a wire wrap or point-to-point construction) that may use a pad pattern. PCBs with assembled components may include, for example, an integrated circuit (IC), such as an application specific integrated circuit (ASIC), or may otherwise be designed using specialized, tailored, or business-specific information. This information regarding design and access to ASIC may be determined using reverse engineering. For example, if an integrated circuit may be part of a board for diagnostic purposes, development purposes, etc. and may be used for development purposes inside a business, that integrated circuit may be exposed to inspection when placed in the open market. Therefore, there is a desire to secure and/or hide access to the parts of the PCB and/or the design of the PCB. One example of securing circuitry of the PCB may be accomplished by blowing a fuse within an IC, which may, for example, disable the functionality protected by the fuse. For example, a blown fuse of an ASICs diagnostic interface may render the ASIC unable to communicate diagnostic data.

Various examples described below relate to providing a conductive pad pattern to mask the trace connection scheme (e.g., the conductive paths) of the PCB design. The pad pattern may have a plurality of indistinguishable, conductive pads were a subset of the pads is to be connected by a component or components to provide access to the electrical path associated with the pad pattern. For example, use of an ASIC through a connector may be protected by placing a pad pattern in the electrical path of the connector and the ASIC, where, by default, no connection is available between the connector and the ASIC until a component is loaded into the proper position on the pad pattern. In that example, the connecting traces of the electrical path may be buried on an inner layer, which may, for example, secure the circuitry design from visual inspection. By using a pad pattern formed to receive components in a predetermined orientation, unauthorized use may be deterred, for example, and trade secrets associated with the PCB may, for example, be protected.

The terms "include," "have," and variations thereof, as used herein, mean the same as the term "comprise" or appropriate variation thereof. Furthermore, the term "based on," as used herein, means "based at least in part on." Thus, a feature that is described as based on some stimulus may be based only on the stimulus or a combination of stimuli including the stimulus.

Figure 1:
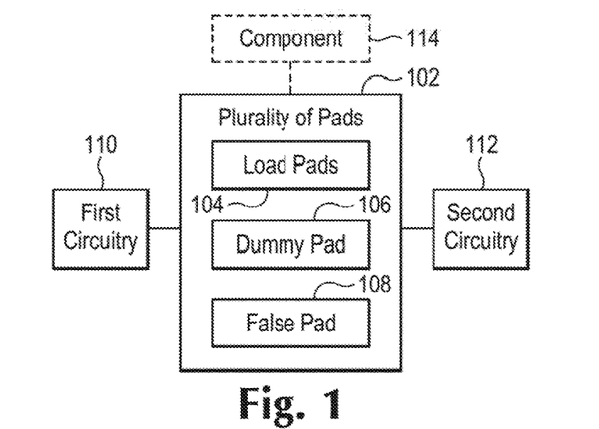
FIG. 1 is a block diagram depicting an example circuit system.

FIG. 1 is a block diagram depicting an example circuit system 100. The example circuit system 100 of FIG. 1 generally comprises a plurality of pads 102, a first circuitry 110, and a second circuitry 112. The plurality of pads 102 generally comprise three classes of pads: load pads 104, dummy pads 106, and false pads 108, which is further discussed in more detail herein. A pad is a surface of conductive material, such as copper, that allows making electrical contact by a component and/or soldering of a component to the PCB. A component used to make contact across pads of the plurality of pads may be a discrete electrical component, such as a capacitor, a resistor, etc. Surface mount components (SMDs) may be discrete electrical components and are generally used with pads on the surface of the PCB (an external layer of the PCB), however, through-hole components may be adapted to use with example circuit systems and/or example PCBs described herein.

In general, an electrical path between the first circuitry 110 and the second circuitry 112 goes through the plurality of pads 102 where a component 114 placed on the load pads 104 may establish the electrical path (e.g., provide a conductive path between a group of pads and/or complete the electrical path) between the first circuitry 110 and the second circuitry 112. The electrical path between the first circuitry 110 and the second circuitry 112 is interrupted by the plurality of pads, and, without a component placed in the proper position, the electrical path may remain incomplete (e.g. electrically broken). An electrical path may remain electrically broken when a component 114 is placed on the dummy pad 106 or false pad 108.

As used herein, a load sequence represents the proper orientation of a component 114 (or a plurality of components) on the pad pattern to establish an electrical path that enables communication between a first circuitry 110 and second circuitry 112. For example, a load sequence may comprise an orientation of components to enable electrical connection between an integrated circuit and a connector, which may further enable communication with the integrated circuit by an external device coupled to the connector, for example. A non-load sequence, as used herein, represents any orientation of a component 114 (or a plurality of components) on the pad pattern that fails to establish the desired electrical path between the first circuitry 110 and the second circuitry 112. An orientation, as used herein, refers to a position (and/or a rotation) of a component with reference to the pad pattern. Thus, an entity desiring to make a connection between the first circuitry 110 and the second circuitry 112 is to place a component 114 in a load sequence, which may be, for example, difficult to distinguish from a non-load sequence due to the plurality of pads being placed in a pattern and due to the electrical paths leading to an internal layer of the PCB that may not be visible by inspecting the surface of the PCB, for example. The plurality of pads may be spaced apart from each other within a distance that allows the component to make contact among pads. For example, the space relationship between pads of the pad pattern may be equal between all pads and/or should not exceed the length of a component to use with the plurality of pads. If a first pad is spaced away from the rest of the plurality of pads at a distance greater than reachable by a component, then an observing entity may, for example, deduce to eliminate the first pad as a possible orientation point for the component. Each pad may have at least one neighbor pad, where a neighbor pad represents a second pad that is reachable by a component from a first pad (e.g., within a range of the first pad as defined by the length of the component).

Figure 2:
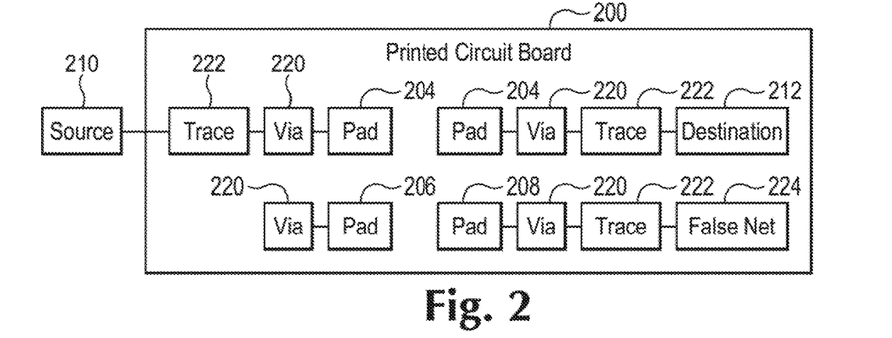
FIGS. 2 and 3 are block diagrams depicting example printed circuit boards.
Figure 3:
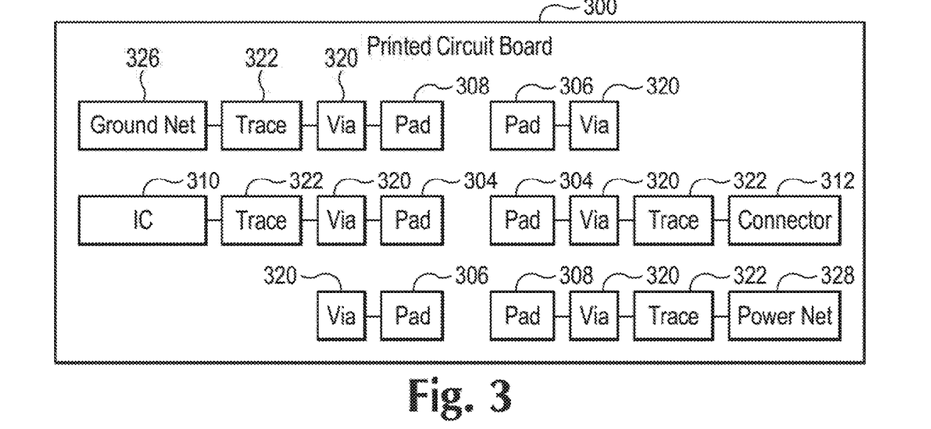

FIGS. 2 and 3 are block diagrams depicting example printed circuit boards 200 and 300. Referring to FIG. 2, the PCB 200 generally comprises a plurality of pads. For simplicity, four pads are depicted in FIG. 2. FIG. 2 depicts a pad 206 as a dummy pad and a pad 208 as a false pad. As used herein, a dummy pad is a conductive pad that is coupled to a via that floats electrically. A via and/or a pad is electrically floating when there is no other electrical connection to a net (e.g., a power net or a ground net) or circuitry (e.g., a component or integrated circuit). For example, the dummy pad may be connected to a via that has no other electrical connections on the via. As used herein, a false pad is a conductive pad that is coupled to a via that is coupled to (e.g., has an electrical connection to) a false circuitry (e.g., rather than the circuitry to be protected from unauthorized access). For example, an electrical path may exist between the false pad and circuitry that is not intended to be protected by the pad pattern, such as a third circuitry of the PCB that provides a first voltage that appears like a second voltage providable between a first circuitry and a second circuitry that are intended to be protected by the pad pattern. A false circuitry represents any other circuitry other than circuitry to be protected by the pad pattern. For another example, the false circuitry may be a random discrete electrical component (such as a resistor or a diode) or a conductive path connected to an integrated circuit that performs publically available operations that do not need to be protected. Example false circuitry comprises any appropriate electrical path other than the electrical path(s) broken by the pad pattern (e.g., an electrical path having misleading traces), an integrated circuit other than any integrated circuits intended for protection by the pad pattern, a false net, etc. A false net, as used herein, is a power net that leads to a power connection or a ground net that leads to a ground connection. A power net provides access to electrical power (e.g., providing electrical power to a trace by connecting the trace to the power net) and a ground net provides access to a ground connection. For example, a power net may comprise a power plane and/or a power rail in the PCB and a ground net may comprise a ground plane. FIG. 3 depicts an example ground net 326 connected to a false pad 308 through an electrical path comprising a trace 322 and a via 320. FIG. 3 also depicts an example power net 328 connected to a false pad 308 through an electrical path comprising a trace 322 and a via 320. In a multi-layer board, for example, a layer may be mostly solid copper to act as a ground plane for shielding and power return. A layer of the PCB, as used herein, may represent a plurality of layers of the PCB.

The dummy pads and false pads may be visually indistinguishable from the other pads of the plurality of pads, but may be electrically distinguishable. The dummy pads and false pads are electrically distinctive, as discussed further herein, because the different classes of pads provide different electrical characteristics upon inspection, such as electrical inspection or other reverse engineering analysis.

The other pads 204 of the plurality of pads of FIG. 2 are load pads and may or may not be electrically distinctive from the dummy pads and false pads. The load pads 204 are connected to electrical paths associated with a source and/or a destination. As used herein, a source and a destination refer to sections of circuitry between which an electrical connection is desired. A load pad, as used herein, acts as a contact point in an electrical path between a first circuitry and a second circuitry. A load sequence is made up of a group of load pads that may act as contact points to establish the electrical path between a first circuitry and a second circuitry. Thus, a false pad, such as false pad 208 of FIG. 2, may connect to a misleading circuitry such as a third circuitry or a false net (e.g., false net 224) that produces a voltage that may have the same electrical characteristics of the source and/or destination.

An electrical path may comprise a plurality of vias (e.g., vias 220 and 320 of FIGS. 2 and 3, respectively) and/or a plurality of traces (e.g., traces 222 and 322 of FIGS. 2 and 3, respectively). In the above example, if a component is connected to the plurality of pads (so that the load pads 204 are in electrical connection with each other) then an electrical path between source 210 and the destination 212 may be completed across the traces, the vias, and the loaded component. If a component was instead placed on a dummy pad 206 or a false pad 208, then an electrical path between the source 210 and the destination 212 would not be established. An electrical path may herein refer to a complete path between a first circuitry and a second circuitry or may refer to a portion of the path. For example, an electrical path may represent the conductive path made between two pads established by a component. For another example, an electrical path may represent a conductive path comprising a plurality of traces and a via, such as a trace leading from a via to a pad and a trace connected to the via and leading into an internal layer of the PCB, such as a trace leading to another via or other circuitry. The PCB may comprise a plurality of traces on an internal layer of the PCB coupled to the group of load pads such that a first trace of the plurality of traces is coupled to a first circuitry and a second trace of the plurality of traces is coupled to the second circuitry. In that example, the group of load pads may comprise conductive pads that, when activated by a component loaded in a load sequence, enable a connection between the first trace and the second trace (e.g., the first trace is coupled to a first pad of the group of pads and the second pad is coupled to a second pad of the group of load pads where the first pad and second pad are activateble by a component).

Each of the plurality of pads 204, 206, and 208 are to appear visually indistinguishable to visual inspection of the layer of the PCB on which the plurality of pads reside. The plurality of pads 204, 206, and 208 are to be formed in a pad pattern on the PCB 200. Forming the plurality of pads in a pad pattern may, for example, misguide an entity examining the PCB 200 from identifying the electrical connection, design, or other protectable information with regard to the PCB 200. For example, a pad pattern may comprise a grid of pads (e.g. pads placed in columns and rows) or offset rows/columns of pads. For another example, the pads may be placed in a pattern representing a common use on a PCB, such as placing the plurality of pads to form a pad pattern that visually appears as a mounting pad for an integrated circuit or a surface mount area with a particular pin distribution. The rows of pads and/or the columns of pads may form any desired geometric shape whether simple (such as a square, a rectangle, a trapezoid, a triangle, etc.) or complex (such as a circular shape, a circular shape without pads in the center, or a shape with an irregular or customized perimeter). In general, a sufficient number of pads and orientation of pads are to be placed as to make the pattern difficult to guess the load pads 204 over the dummy pads 206 and false pads 208. The pad pattern may be generally formed to be capable of receiving, a discrete component in a plurality of orientations. A pad pattern capable of receiving a discrete component (or a plurality of discrete components) in a plurality of orientations may, for example, hinder guessing the correct orientation (i.e., the load sequence).

Referring FIG. 3, an example circuit system is implemented as an example PCB 300. The PCB 300 depicts an example representation of an example circuit system comprising a plurality of pads (e.g., pads 304, 306, and 308) in a pad pattern, a plurality of traces 322, a plurality of vias 320, an integrated circuit 310, and a connector 312. The integrated circuit 310 and the connector 312 are example representations of source circuitry 210 and destination circuitry 212 as discussed with regards to FIG. 2. A connector, as used herein, represent circuitry that acts an interface for an external electrical device to connect to the PCB.

The pad pattern of FIG. 3 comprises a first number of pads greater than a second number of pads connectable by a component associated with a group of pads within the pad pattern to establish an electrical path between a first pad of the group of pads and a second pad of the group of pads. In other words, a number of pads that exist on the pad pattern may be greater than the number of pads used to form an electrical path between the integrated circuit 310 and the connector 312. The group of pads may comprise false pads 308, such as a power connection pad connected to a power net 328 and a ground connection pad connected to a ground net 326.

The integrated circuit 310 may be coupled to the pad pattern by a first trace of a plurality of traces 322 that is located at a first layer of the circuit system. The connector 312 may be coupled to the pad pattern by a second trace of the plurality of traces 322 that is located at a second layer of the circuit system. The integrated circuit 310 is operable to communicate through the connector 312 in response to activation of the group of pads. Activation of the group of pads may be accomplished by loading a component in the proper orientation on the group of pads based on a load sequence.

The plurality of traces 322 are coupled to the group of pads by a plurality of vies 320. As discussed herein, the plurality of traces 322 may be activateable upon a component connection in accordance with a load sequence. For example, the electrical path between the integrated circuit 310 and the connector 312 may be established and made usable (e.g., activateable) by connecting a component to the load pads 304, and the traces 322 coupled with the integrated circuit 310 and the connector 312 may not be activated until the component is loaded on the load pads 304.

The group of pads of FIG. 3 may comprise a plurality of false pads 308 and a plurality of dummy pads 306. The plurality of dummy pads 306 may be visually indistinguishable from load pads 304, but may have no voltage output. The plurality of false pads 308 may produce various voltage outputs, which may or may not be the same voltage outputs of the load pads 304. For example, a first false pad may provide different voltage output as a first load pad of the group of load pads and a second false pad may provide the same voltage output as a first load pad of the group of load pads. By providing a variety of voltage outputs, analysis using an electrical analysis device (such as a multimeter) may be deterred, and an entity may select to use a false over a load pad due to the voltage output of the false pad.

The pad pattern may be placed on an external layer of the circuit system (e.g., the PCB 300) for surface mount access. The plurality of traces 322 may be placed on an internal layer of the circuit system. For example, an internal layer of the PCB may comprise the traces of the first layer that connect to the integrated circuit and the traces of the second layer that connect to the connector. As discussed further herein, the traces between a source circuitry and a destination circuitry may be on the same layer or separate layers. For example, using the above example layers, the first layer and the second layer may comprise the same layer of the PCB 300 or may be different layers of the PCB 300.

Figures 4, 5:
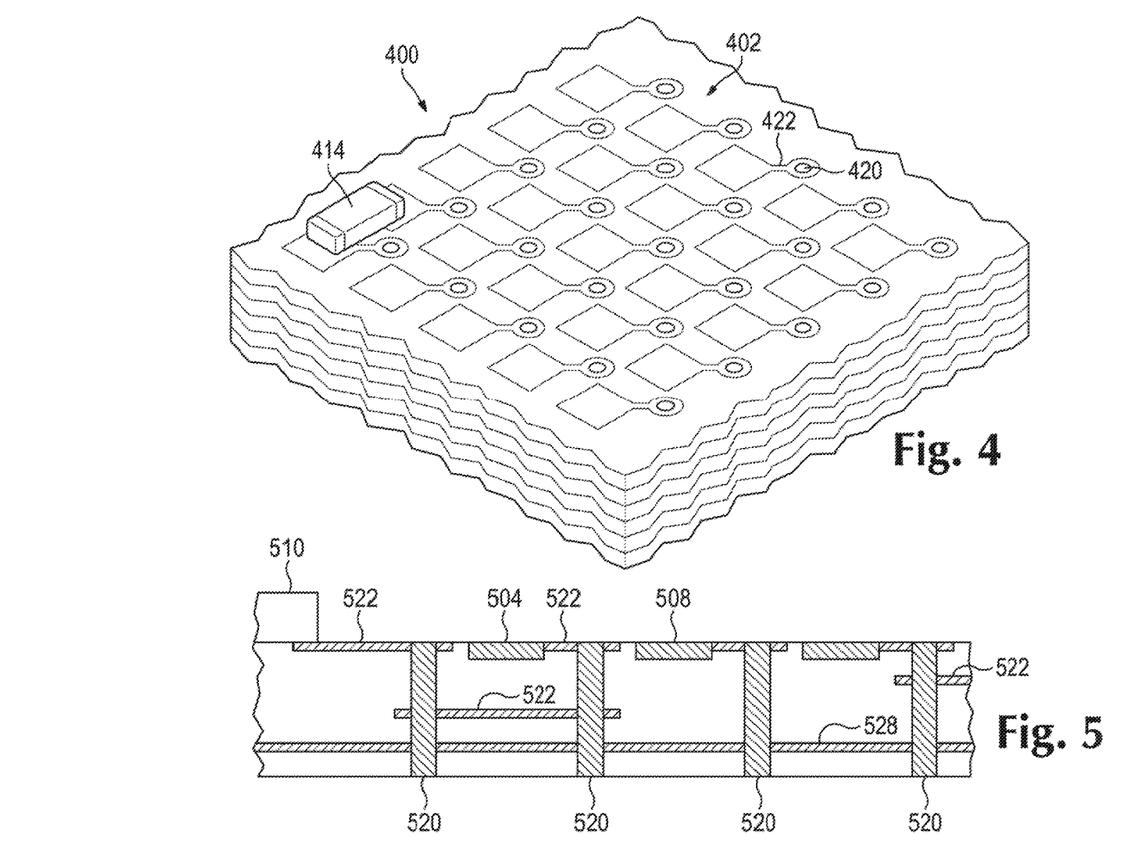
FIG. 4 depicts a perspective view of an example printed circuit board.
FIG. 5 depicts a side view of an example printed circuit board.

Referring to FIGS. 4-6F, an example portion of the entire example PCB is depicted for simplicity. FIG. 4 depicts a perspective view of an example PCB 400. The example PCB 400 of FIG. 4 is shown as comprising an example number of six layers of the PCB 400. The plurality of pads 402 are shown in a pad pattern of a square grid of the size of five pads. A grid pad pattern may generally have a grid size that is a first number (i.e., a width of the grid) by a second number (i.e., a length of the grid) where both the first number and the second number are greater than a number of components to be placed on the pad pattern (e.g., greater than the number of components used to complete an electrical connection between a source and a destination.) A component, such as a SMD 414 of FIG. 4, may be placed across pads to make contact with the electrical paths with the vias.

Each example pad is coupled to a via 420 by a trace 422. As depicted in FIG. 4, each of the plurality of pads 402 (and associated traces 422 and vias 420 viewable fro the surface) appear indistinguishable to the other pads as to not hint at which pads are the correct pads for the load sequence. This may assist, for example, in misleading an unauthorized entity from access to circuitry protected by the pad pattern. Other attributes of the pad pattern that may, for example, mislead an unauthorized attempt at access may include rules for establishing the number of each class of pad and the positions of each class of pad. An example rule may be to make less than a certain number of pads as false pads that are neighbors to (e.g., orthogonal to) each of the plurality of pads, where the certain number of pads is the number of neighbor pads that are within a first distance that is reachable based on a length of a component usable with the plurality of pads. For example, in a grid, each pad may have four neighbor pads and less than four false pads may be orthogonal to each of the plurality of pads to increase the probability that each pad is a likely candidate for the load sequence. Another example rule may be to arrange the plurality of pads so that a non-dummy pad may be orthogonal to each of the plurality of pads. A non-dummy pad, as used herein, refers to a false pad or a load pad. In that example, it may be prudent to establish a pad pattern without a section of dummy pads close together because a group of dummy pads may eliminate the possibility of a connection (e.g., by a multimeter, for example, showing no voltage output). Yet another example rule may be that the plurality of pads may comprise a number of pads described by a ratio of a number of dummy pads to an equal number of non-dummy pads. Each of these above examples may, for example, diversify the pattern and improve the chances of misleading an unauthorized entity from performing a successful reverse engineering analysis. For example, an equal ratio of dummy pads to non-dummy pads may increase the possible combinations of orientations where an unequal amount may remove certain pads from possible orientations.

FIG. 5 depicts a side view of an example PCB. In general, the example side view depicts a cross section of an example PCB, such as example PCB 400 of FIG. 4, and depicts the electrical paths from the surface mountable pads to an internal layer by using a via 520. The load pad 504 is depicted as being connected to an integrated circuit 510 by an electrical path comprising two vias 520, a trace 522 between the two vias, and a trace 522 between the integrated circuit 510 and the via 520. The false pad 508 is depicted as coupled to a via 520 that connects to a false net 528, such as a power plane or ground plane, that may extend across the entirety of the PCB at a layer or part of the PCB.

Figure 6A:
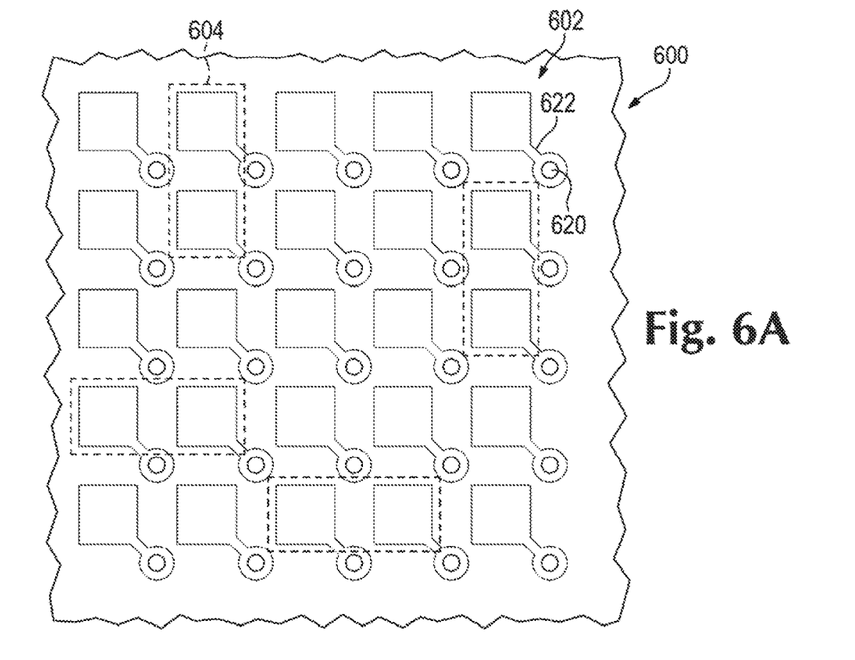
FIGS. 6A through 6F depict top views of example layers of an example printed circuit board.
Figure 6B:
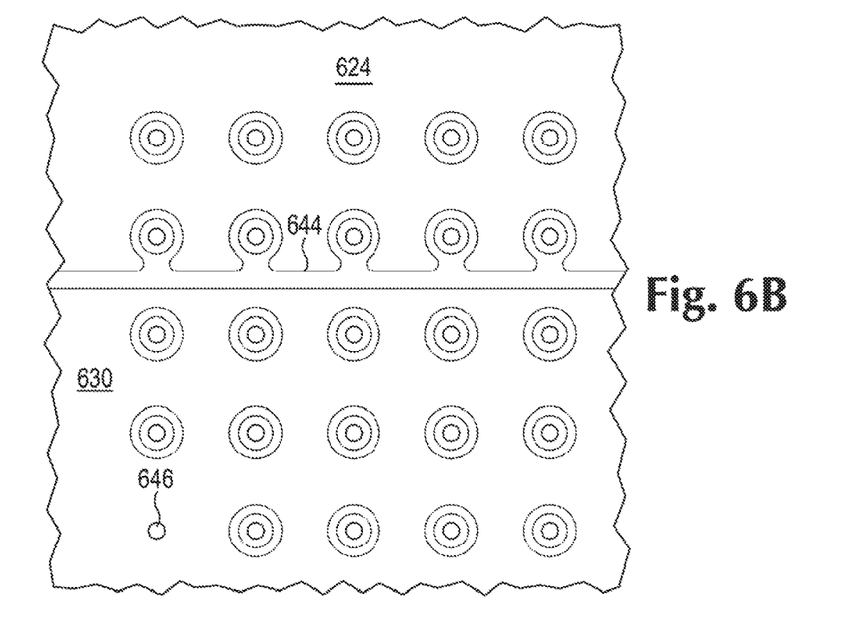
Figure 6C:
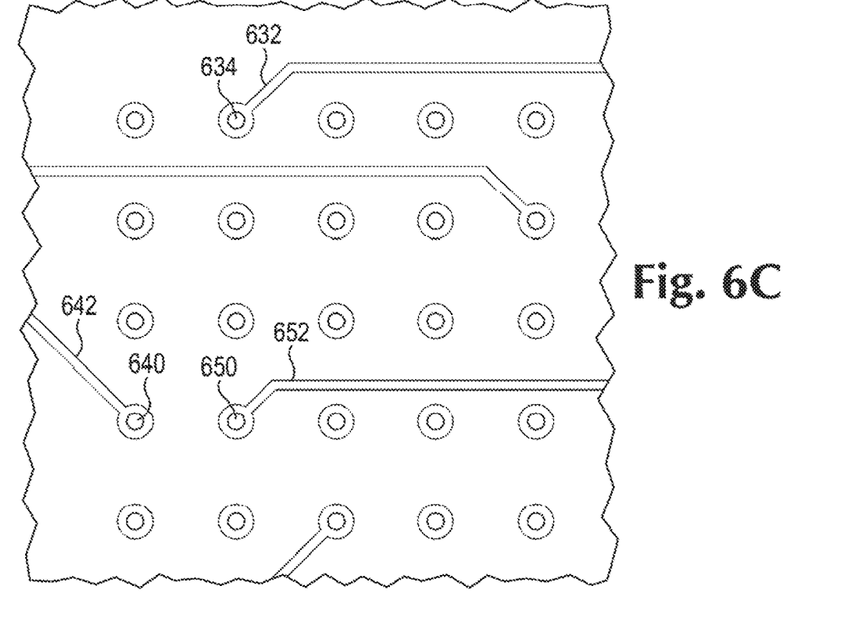
Figure 6D:
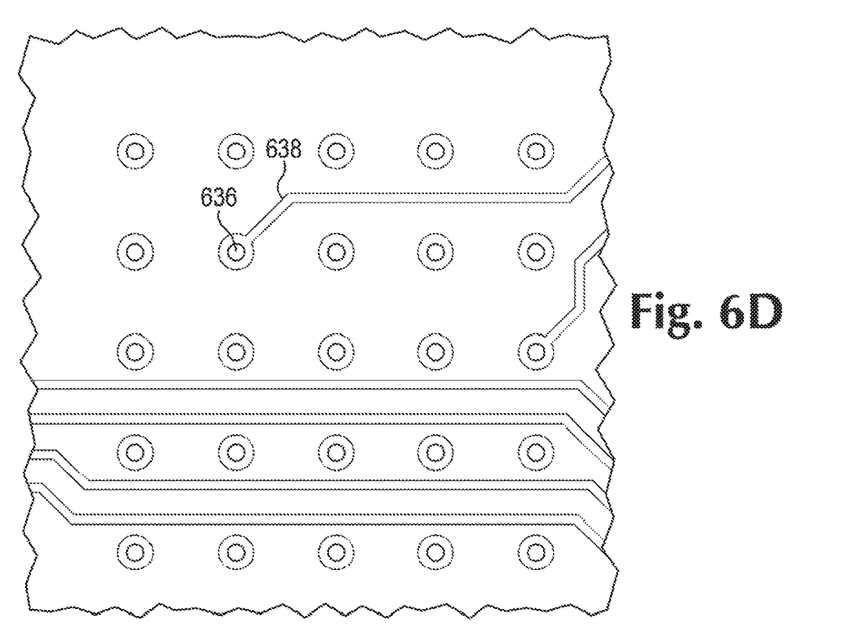
Figure 6E:
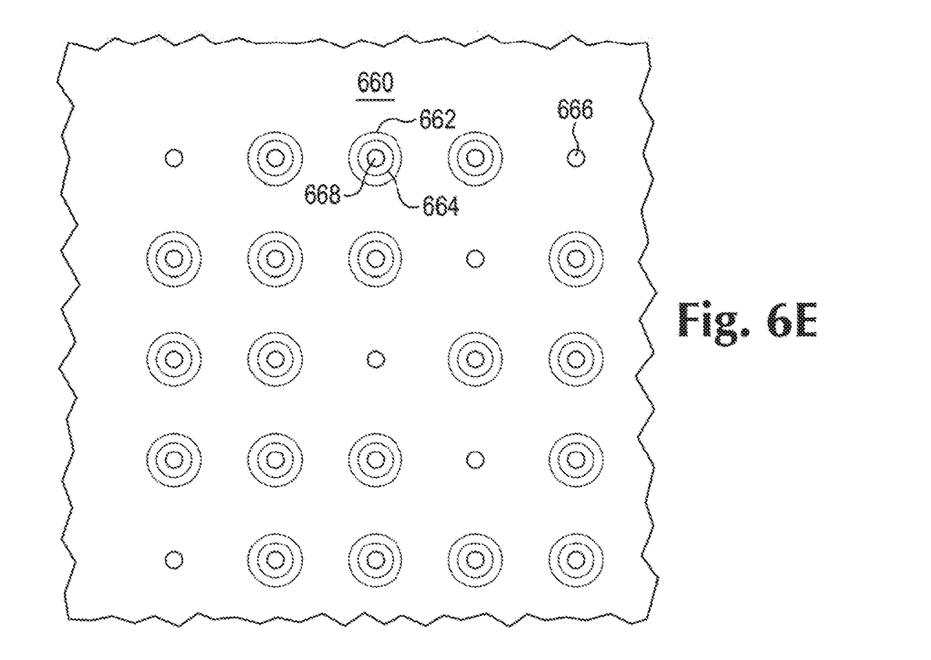
Figure 6F:
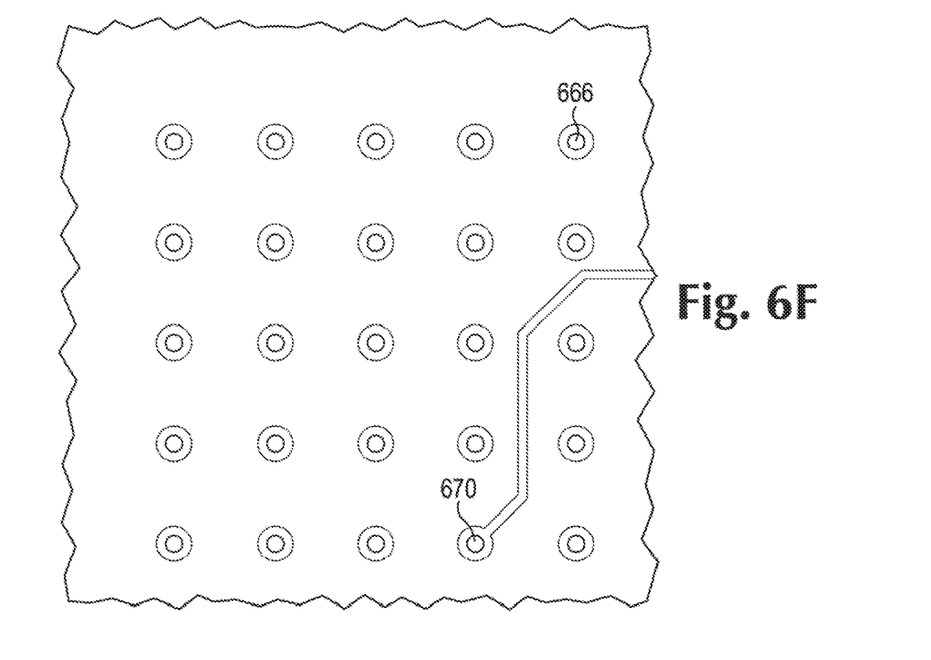

FIGS. 6A through 6F depict top views of example layers of an example PCB. FIGS. 6A and 6F represent the layers of the example PCB 400 of FIG. 4. Referring to FIG. 6A, the layer 500 comprises a plurality of pads 602 formed in a pad pattern, in particular a five by five grid of pads. The plurality of pads 602 as well as the traces 622 and the vias 620 (and orientation thereof) are visually indistinguishable as to, for example, indicated which pads are used to complete the load sequence and, for example, provide access to circuitry protected by the pad pattern. The layer 600 may be an external layer for access to the pads for connecting a component (e.g., laying and/or soldering a component to a plurality of pads).

The pads outlined by the dotted areas 604 represent the group of load pads defining an example load sequence. For example, when a component is oriented at the orientations (e.g., positions) of the example load sequence, then a correct electrical path may be established and access to a particular circuitry may be made available, for example. The wrong orientation (e.g., a position that is not associated with a load pad) may not establish the correct electrical paths and the circuitry may remain secure from unauthorized access until the component is placed in the correct orientation. In general, the pads that are not outlined by dotted lines in FIG. 6A may be classified as either a dummy pad or a false pad.

In the example of FIG. 6A, the load sequence comprises the example positioning of four components and the example group of load pads comprises four pairs of load pads associated with the number of components to establish the load sequence. Any appropriate number of pairs of load pads may be used. The number of pads to be connected by a component may be determined by the class of circuitry being secured by the pad pattern and/or the type of components used with the pad pattern. For example, a component used in the load sequence may have three or four contact points (e.g., the number of pins of a component) that are to make contact with pads on the pad pattern. The number of contact points made by a component may be greater than one. The number of groups of load pads, such as load pad pairs, may be determined by the number of electrical paths used in communication with the circuitry being secured by the pad pattern. For example, some source circuitries may utilize four channels for communication while a second circuitry may use two channels for communication. In that example, an associated number of components may be used to complete the electrical paths for the particular communication channels (e.g. four discrete components or two discrete components, respectively).

As understood with reference to FIGS. 6A through 6F, some pad pairs may be electrically coupled to traces that are on the same layer and/or may be electrically coupled to traces that are on different layers. Referring to FIG. 6B, a PCB layer may comprise a false plane, such as a ground plane or a power plane, which covers an entire cross-section of a layer or a portion of a cross-section of a layer. For example, the layer depicted by FIG. 6B may provide two power planes to use as false nets that may provide different voltage outputs with any vias connected to the power planes, such as via 646 connected to power plane 630. The planes of FIG. 6B are depicted has having a gap 644 between false plane 624 and false plane 630. The layer depicted by FIG. 6E also depicts an example use of a false plane 660. Referring to FIG. 6E, a via 668 is depicted has having a copper ring 664 and an insulation ring 662 (e.g., a ring where the copper has been etched) electrically disconnecting the via 668 to the plane 660 while a via 666 may have a conductive material, such as a copper ring (not shown), that connects the via 666 to the false plane 660. With reference to the examples of FIGS. 6A through 6F, the via 568 may represent a via that floats electrically and the pad associated with via 668 may be an example dummy pad. With reference to the examples of FIGS. 6A through 6F, the pads associated with vias 646 and 666 may represent example false pads.

FIGS. 6C and 6D depict example internal layers. Traces 632, 642, 652, and 638 lead to other locations on the PCB, such as to an integrated circuit or a connector. For example, a pair of load pads may be coupled to vias 640 and 650 and a component on the layer 600 of 6A may complete the electrical path between traces 642 and 652. The internal electrical path in the above example is depicted as being on the same internal layer. In addition or alternatively, a component placed to make contact with a pair of load pads may form an electrical path that has traces on a plurality of layers. For example, the via 634 is coupled lo a trace 632 on the layer depicted by BC and the via 636 is coupled to a trace 638 on the layer depicted by 6D. In that example, soldering a component to the pair of load pads coupled with the vies 634 and 636 as exposed on the layer 600 of FIG. 6A may allow for an electrical path to be established that is distributed across the plurality of layers depicted by 6A, 6C, and 6D.

FIG. 6F depicts an example external layer with a via 670 coupled to a trace exposed on the example external layer. However, security against unauthorized access to circuitry may be improved, for example, by maintaining the secured electrical paths within traces on the internal layers and providing access to the internal trace paths through vias that lead to plurality of pads 602 on the surface.

Figure 7:
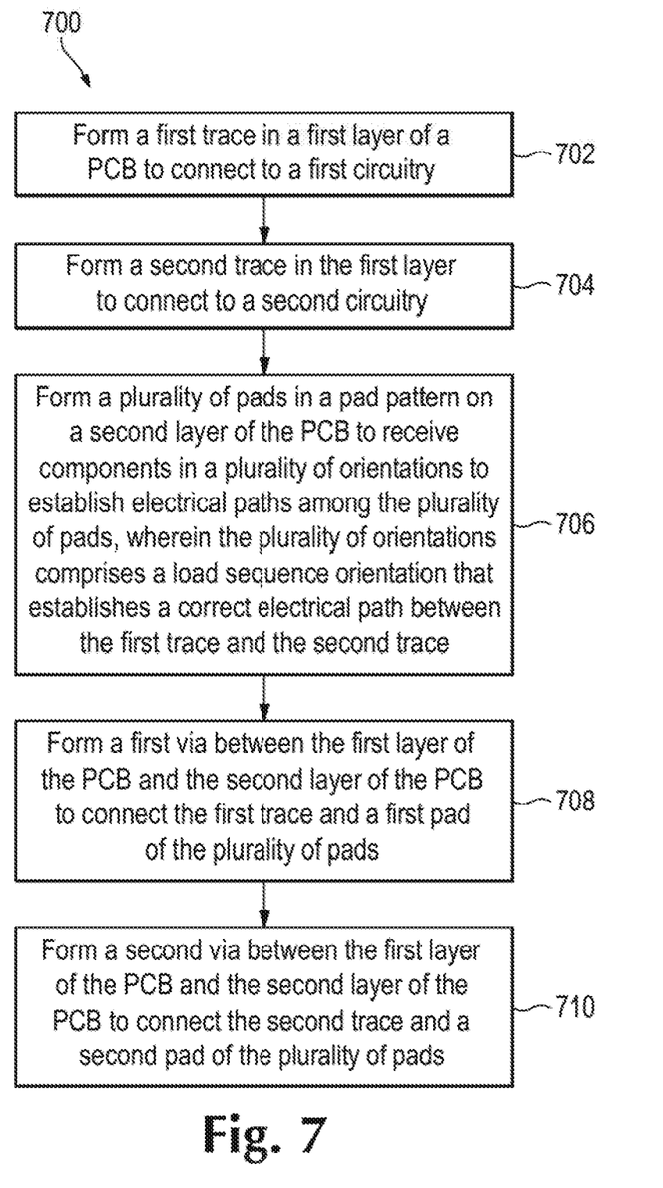
FIG. 7 is a flow diagram depicting an example manufacturing process.

FIG. 7 is a flow diagram depicting an example manufacturing process. Referring to FIG. 7, the example manufacturing process may generally comprise forming a PCB with a pad pattern.

At block 702, a first trace is formed in a first layer of a PCB to connect to a first circuitry (e.g., establish an electrical path to an integrated circuit). The first trace may be placed in an internal layer. By forming the traces to the source circuitry and/or destination circuitry in an internal layer, the electrical path may, for example, be hidden from an entity visually observing the PCB. A second trace may be formed in the first layer to connect to a second circuitry (e.g., establish an electrical path to a connector) at block 704.

At block 706, a plurality of pads are formed in a pad pattern on a second layer of the PCB. The plurality of pads are formed to receive a component in a plurality of orientations to establish an electrical path among the plurality of pads. The plurality of orientations may comprise a load sequence orientation that establishes a correct electrical path between the first trace formed at block 702 and the second trace formed at block 704. The plurality of orientations may comprise a non-load sequence orientation that establishes a false electrical path (e.g., an electrical path that is not between the first trace formed at block 702 and the second trace formed at block 704). Example non-load sequence orientations include an orientation of a component that contacts a dummy pad or an orientation that forms a false electrical path with a false pad or plurality of false pads that connect to false circuitry.

The traces and/or pads formed at blocks 702, 704, and 706 may be formed of conductive material. For example, the plurality of pads may be made of conductive material from a group consisting of copper, metal alloy, and tin. The conductive material may be etched on each layer and once the internal electrical paths are established at each layer, vias may be formed to provide electrical paths between the layers. For example, the layers may be stacked and holes may be drilled through the stack to create the vias, as discussed herein with reference to blocks 708 and 710.

At block 708, a first via is formed between the first layer of the PCB and the second layer of the PCB to connect the first trace and a first pad of the plurality of pads (e.g., to establish an electrical path between the first trace and the first pad). At block 710, a second via is formed between the first layer of the PCB and the second layer of the PCB to connect the second trace and a second pad of the plurality of pads (e.g., to establish an electrical path between the second trace and the second pad). In this manner, the electrical paths are formed to establish an electrical connection between the integrated circuit and the connector upon receipt of a component in a proper orientation defined by the load sequence, and, without the component, a break would exist in the electrical path between the integrated circuit and the connector. A PCB formed using blocks 702-710, may be provided in to the public while being able to, for example, protect integrated circuits used for company-internal diagnostic purposes from access by the public.

Although the flow diagram of FIG. 7 illustrates a specific order of execution, the order of execution may differ from that which is illustrated. For example, the order of execution of the blocks may be scrambled relative to the order shown. Also, the blocks shown in succession may be executed concurrently or with partial concurrence. All such variations are within the scope of the present description.

All of the features disclosed in this specification (including any accompanying claims, abstract and drawings), and/or all of the elements of any method or process so disclosed, may be combined in any combination, except combinations where at least some of such features and/or elements are mutually exclusive.

The present description has been shown and described with reference to the foregoing examples. It is understood, however, that other forms, details, and examples may be made without departing from the spirit and scope of the following claims. The use of the words "first," "second," or related terms in the claims are not used to limit the claim elements to an order or location, but are merely used to distinguish separate claim elements.

What is claimed is:

1. A printed circuit board (PCB) comprising:
   a plurality of pads that form a pad pattern on the PCP, the plurality of pads comprising:
      a group of load pads that act as contact points to establish an electrical path between a first circuitry and a second circuitry;
      a dummy pad coupled to a first via that floats electrically; and
      a false pad coupled to a second via that couples to a third circuitry.

2. The PCB of claim 1, wherein:
   the pad pattern is a grid having a size that is a first number by a second number, the first number being greater than a number of components and the second number being greater than the number of components; and
   the group of load pads comprises pairs of load pads associated with the number of components.

3. The PCB of claim 1, wherein a non-dummy pad is orthogonal to each of the plurality of pads, the non-dummy pad comprising the false pad or a first load pad of the group of load pads.

4. The PCB of claim 1, wherein less than a first number of false pads are orthogonal to each of the plurality of pads, where the first number is a number of pads that are within a first distance that is reachable based on a length of a component usable with the plurality of pads.

5. The PCB of claim 1, wherein the plurality of pads comprises a number of pads described by a ratio of a number of dummy pads to an equal number of non-dummy pads.

6. The PCB of claim 1, comprising:
   a plurality of traces on a second layer of the PCB coupled to the group of load pads, the second layer being an internal layer of the PCB where a first trace of the plurality of traces is coupled to the first circuitry and a second trace of the plurality of traces is coupled to the second circuitry,
   wherein the group of load pads comprises conductive pads that, when activated by a component loaded in a load sequence, enable a connection between the first trace and the second trace.

7. The PCB of claim 6, wherein:
   the plurality of pads are made of a conductive material from a group consisting of copper, metal alloy, and tin.

8. The PCB of claim 1, comprising:
   each of the plurality of pads appear visually indistinguishable to inspection of the first layer of the PCB.

9. The PCB of claim 1, wherein:
   the plurality of pads visually appears as a mounting pad for an integrated circuit.

10. The PCB of claim 1, wherein:
    the false pad provides a different voltage output as a first load pad of the group of load pads.

11. The PCB of claim 1, wherein:
    the false pad provides a same voltage output as a first load pad of the group of load pads.

12. A circuit system comprising:
    a pad pattern comprising a first number of pads greater than a second number of pads connectable by a component associated with a group of pads within the pad pattern to establish an electrical path between a first pad of the group of pads and a second pad of the group of pads, the group of pads comprising a power connection pad connected to a power net and a ground connection pad connected to a ground net;

a plurality of traces coupled to the group of pads by a plurality of vias, the plurality of traces activateable upon a component connection in accordance with a load sequence;

an integrated circuit coupled to the pad pattern by a first trade of the plurality of traces, the first trace located at a first layer of the circuit system; and a connector coupled to the pad pattern by a second trace of the plurality of traces, the second trace located at a second layer of the circuit system, the is integrated circuit operable to communicate through the connector in response to activation of the group of pads, wherein the load sequence comprises an orientation of components to enable connection between the integrated circuit and the connector.

13. The circuit system of claim 12, wherein the pad pattern comprises:

a plurality of false pads having various voltage outputs; and a plurality of dummy pads having no voltage output.

14. The circuit system of claim 12, wherein:

an internal layer of the circuit system comprises the first layer and the second layer; and an external layer of the circuit system comprises the pad pattern.

15. A manufacturing process comprising:

forming a first trace in a first layer of printed circuit board (PCB) to connect to a first circuitry, the first layer comprising internal layer;

forming a second trace in the first layer to connect to a second circuitry;

forming a plurality of pads in a pad pattern on a second layer of the PCB to receive a component in a plurality of orientations to establish an electrical path among the plurality of pads, wherein the plurality of orientations comprises a load sequence orientation that establishes a correct electrical path between the first trace and the second trace;

forming a first via between the first layer of the PCB and the second layer of the PCB to connect the first trace and a first pad of the plurality of pads; and forming a second via between the first layer of the PCB and the second layer of the PCB to connect the second trace and a second pad of the plurality of pads.

* * * * *

UNITED STATES PATENT AND TRADEMARK OFFICE
CERTIFICATE OF CORRECTION

PATENT NO. : 10,349,517 B2
APPLICATION NO. : 15/570879
DATED : July 9, 2019
INVENTOR(S) : Charles Nathan Logan et al.

Page 1 of 1

It is certified that error appears in the above-identified patent and that said Letters Patent is hereby corrected as shown below:

In the Claims

In Column 10, Line 5, in Claim 1, delete "PCP," and insert -- PCB, --, therefor.

In Column 11, Line 6, in Claim 12, delete "trade" and insert -- trace --, therefor.

In Column 11, Line 10, in Claim 12, delete "the is" and insert -- the --, therefor.

In Column 12, Line 4, in Claim 15, delete "of" and insert -- of a --, therefor.

In Column 12, Line 6, in Claim 15, delete "comprising" and insert -- comprising an --, therefor.

Signed and Sealed this
Twenty-sixth Day of November, 2019

Andrei Iancu
*Director of the United States Patent and Trademark Office*